(12) United States Patent
Yamamoto et al.

(10) Patent No.: US 9,017,830 B2
(45) Date of Patent: Apr. 28, 2015

(54) SHEARING DIE AND METHOD FOR MANUFACTURING THE SAME

(75) Inventors: Kenji Yamamoto, Hyogo (JP); Yasuhiro Hayashida, Hyogo (JP); Junji Yoshida, Toyama (JP)

(73) Assignees: Kobe Steel, Ltd., Kobe-shi (JP); Nippon Koshuha Steel Co., Ltd., Tokyo (JP)

( * ) Notice: Subject to any disclaimer, the term of this patent is extended or adjusted under 35 U.S.C. 154(b) by 340 days.

(21) Appl. No.: 13/170,568

(22) Filed: Jun. 28, 2011

(65) Prior Publication Data

US 2011/0314991 A1    Dec. 29, 2011

(30) Foreign Application Priority Data

Jun. 29, 2010   (JP) ................................. 2010-147187

(51) Int. Cl.
| | | |
|---|---|---|
| *B32B 9/00* | (2006.01) | |
| *C23C 14/06* | (2006.01) | |
| *B26D 1/00* | (2006.01) | |
| *B21D 28/00* | (2006.01) | |
| *B21D 37/01* | (2006.01) | |
| *B23D 35/00* | (2006.01) | |
| *B23P 15/24* | (2006.01) | |

(52) U.S. Cl.
CPC ............ *C23C 14/0664* (2013.01); *B21D 28/00* (2013.01); *B21D 37/01* (2013.01); *B23D 35/001* (2013.01); *B23P 15/24* (2013.01)

(58) Field of Classification Search
CPC ...... B26F 1/14; B26F 1/44; B26F 2001/4436; B21D 28/00; B21D 28/14; B21D 37/01; B23D 35/001

See application file for complete search history.

(56) References Cited

U.S. PATENT DOCUMENTS

| 5,656,383 | A | 8/1997 | Tanaka et al. |
| 6,397,651 | B2 * | 6/2002 | Usui et al. ........................ 72/294 |
| 2005/0003239 | A1 * | 1/2005 | Derflinger et al. ............ 428/698 |
| 2006/0154108 | A1 | 7/2006 | Fukui et al. |
| 2007/0184306 | A1 | 8/2007 | Yamamoto et al. |

(Continued)

FOREIGN PATENT DOCUMENTS

| JP | 7-197235 | 8/1995 |
| JP | 8-325706 | 12/1996 |

(Continued)

OTHER PUBLICATIONS

Korean Office Action issued Oct. 23, 2012, in Korea Patent Application No. 10-2011-0063344 (with English translation).

(Continued)

*Primary Examiner* — David Sample
*Assistant Examiner* — Seth Dumbris
(74) *Attorney, Agent, or Firm* — Oblon, McClelland, Maier & Neustadt, L.L.P.

(57) ABSTRACT

The present invention provides a shearing die having longer life and a method for manufacturing the same. The shearing die includes a pair of substrates, at least one of which has a hard film formed by an arc ion plating method and located at least on a region of a curved surface and on an adjacent region from the end part of the curved surface on the side facing to the surface of the sheet or plate material to 300 μm along the surface of the substrate. The hard film comprises Al and one or more of Ti and Cr, and has a thickness of 1 to 5 μm, such that a number of metal particles having a diameter of 20 μm or more, which are present on a line segment having a length of 10 mm on a surface of the hard film, is 2 or less.

8 Claims, 5 Drawing Sheets

(56) References Cited

U.S. PATENT DOCUMENTS

| | | | |
|---|---|---|---|
| 2008/0171183 A1* | 7/2008 | Yamamoto | 428/215 |
| 2008/0298910 A1* | 12/2008 | Weber et al. | 407/119 |
| 2009/0269614 A1 | 10/2009 | Yamamoto et al. | |
| 2010/0035120 A1 | 2/2010 | Sato et al. | |
| 2010/0047545 A1* | 2/2010 | Yamamoto et al. | 428/220 |
| 2010/0215912 A1 | 8/2010 | Kubota et al. | |

FOREIGN PATENT DOCUMENTS

| | | | |
|---|---|---|---|
| JP | 8-325707 | | 12/1996 |
| JP | 2000-343151 | | 12/2000 |
| JP | 2002-30413 | | 1/2002 |
| JP | 2003-19523 | | 1/2003 |
| JP | 2005-271190 | | 10/2005 |
| JP | 2005-305510 | * 11/2005 | ............ B21D 37/20 |
| JP | 2005-305510 A | | 11/2005 |
| JP | 2007-204820 | | 8/2007 |
| JP | 2008-7835 | | 1/2008 |
| JP | 2008-204876 A | | 9/2008 |
| JP | 2008-270092 A | | 11/2008 |
| JP | 2009-263717 A | | 11/2009 |
| JP | 2010-099735 A | | 5/2010 |
| WO | 2009-025112 | | 2/2009 |
| WO | 2009-047867 | | 4/2009 |

OTHER PUBLICATIONS

Korean Office Action issued Apr. 23, 2013, in Korea Office Action No. 10-2011-0063344 (with English translation).

Extended European Search Report issued Oct. 5, 2011 in patent application No. 11005313.9.

Kazuki Takahara, et al., "The industrial development of AIP system technologies", Kobe Steel Engineering Reports, vol. 50, No. 2, Sep. 2000, pp. 53-57 (with English Abstract and partial English language translation).

* cited by examiner

SHEARING DIE AND METHOD FOR MANUFACTURING THE SAME

CROSS-REFERENCE TO RELATED APPLICATIONS

This application claims priority from Japanese Patent Application No. 2010-147187 filed on Jun. 29, 2010, the entire subject matter of which is incorporated herein by reference.

BACKGROUND OF THE INVENTION

1. Technical Field

The present invention relates to a shearing die for shearing a sheet or plate material, and a method for manufacturing the shearing die.

2. Background Art

With an increase in strength of metal materials such as high-tensile steel products, the shortened life of shearing dies used for shearing of sheet or plate materials composed of the metal materials have become a problem. Accordingly, in order to solve this problem, techniques of forming various hard films as described below on substrates of the dies have now been created.

For example, Patent Document 1 discloses a technique of forming a ceramic of any one of carbides, nitrides and carbonitrides of the group IV elements on a substrate surface of a shearing flat-blade knife. Further, Patent Document 2 discloses a technique of forming a ceramic of a titanium nitride as an inner layer, a titanium metal layer as an intermediate layer and a ceramic of a titanium nitride as an outer layer on a substrate surface of a shearing flat-blade knife.

Furthermore, Patent Document 3 discloses a method for manufacturing a die for punch press, in which after heat treatment, cutting, electric discharge working and the like are performed to a substrate of the die, a nitride layer is formed by ion nitriding on a cutting blade part of the die or a contact part of the die with a sheet or plate material, and thereafter ion plating is performed with titanium evaporating particles, thereby forming a film of a nitride, carbide or carbonitride of titanium on a surface part of the die.

It has been conceivable herein that the main causes for damage of a shearing die are fatigue fracture of the die caused by repeated application of impact and wear of a cutting blade part of the die caused by friction with a sheared sheet or plate material. Accordingly, the damage of the shearing die can be decreased to some degree by applying the hard films having high hardness disclosed in Patent Documents 1 to 3 to the shearing die.

Patent Document 1: JP-A-8-325706
Patent Document 2: JP-A-8-325707
Patent Document 3: JP-A-2000-343151

SUMMARY OF THE INVENTION

However, in the techniques disclosed in Patent Documents 1 to 3, the carbides, nitrides or carbonitrides of the group IV elements are used as the hard films, so that the dies have a hardness of about 2,500 HV (Vickers Hardness), and this hardness is insufficient. Accordingly, the techniques disclosed in Patent Documents 1 to 3 still remain to have a problem in terms of longer life.

Further, in the technique disclosed in Patent Document 3, the hard thin film is formed after hardening treatment of the substrate by ion nitriding. However, since the substrate itself is cured, the whole die becomes rather brittle, thereby promoting early breakage of the die.

In addition, the shearing die usually has a right-angled or acute-angled shearing part, different from a plastic forming die such as a bending or drawing die, and a stress applied to the shearing die is also different from that applied to the plastic forming die. Accordingly, a surface treatment technique specific to the shearing die becomes necessary.

The invention has been made in view of the above-mentioned problems, and an object thereof is to provide a shearing die having longer life and a method for manufacturing the same.

The present invention provides the following shearing die and method for manufacturing the same.

(1) A shearing die comprising a pair of substrates, which is used for shearing a sheet or plate material disposed therebetween by the pair of substrates, wherein at least one of the substrates is composed of a steel, a cemented carbide or a ceramic, and said at least one of the substrates comprise a blade edge having a shape of a curved surface for shearing the sheet or plate material and a surface continuing from the curved surface and facing to a surface of the sheet or plate material, a hard film formed by an arc ion plating method is provided at least on a region of the curved surface and a region from the end part of the curved surface on the side facing to the surface of the sheet or plate material to 300 μm along the surface of the substrate, of the surface of said at least one of the substrates, and the hard film comprises Al and one or more of Ti and Cr, and has a thickness of 1 μm or more and 5 μm or less, and the number of a metal particle having a diameter of 20 μm or more, which is present on a line segment having a length of 10 mm on a surface of the hard film formed on the region of the curved surface and the region from the end part of the curved surface on the side facing to the surface of the sheet or plate material to 300 μm along the surface of the substrate, is 2 or less.

As describe above, in the shearing die according to the invention, the hard film is formed at least on the region of the curved surface and the region from the end part of the curved surface on the side facing to the surface of the sheet or plate material to 300 μm along the surface of the substrate, whereby a region to which a high stress is applied, of the surface which comes into contact with the sheet or plate material at the time of shearing the sheet or plate material, can be properly protected.

Further, the hard film of the shearing die according to the invention comprises Al and one or more of Ti and Cr, so that the shearing die can be protected by the hard film having excellent wear resistance and durability. Further, the hard film of the shearing die according to the invention has a thickness of 1 μm or more and 5 μm or less, so that separation or breakage of the film can be avoided from occurring in an interface between the substrate and the hard film or in the inside of the hard film.

Furthermore, in the hard film of the shearing die according to the invention, the number of metal particles contained in the hard film formed on the region of the curved surface and the region from the end part of the curved surface on the side facing to the surface of the sheet or plate material to 300 μm along the surface of the substrate is limited to the specific number, thereby being able to inhibit damage of the hard film at the time of shearing the sheet or plate material.

(2) The shearing die according to (1), wherein a maximum peak height (Rp) of the surface of the hard film as a parameter of the surface roughness is 1.0 μm or less.

As described above, in the hard film of the shearing die according to the invention, the maximum peak height (Rp) is limited to 1.0 μm or less, thereby being able to decrease unevenness of the surface which causes damage of the hard film.

(3) The shearing die according to (1) or (2), wherein the hard film is composed of $(Ti_aCr_bAl_cSi_d)(C_{1-x}N_x)$, satisfying:

$0 \leq a \leq 0.3$;
$0.1 \leq b \leq 0.5$;
$0.3 \leq c \leq 0.7$;
$0 \leq d \leq 0.2$;
$a+b+c+d=1$; and
$0.7 \leq x \leq 1$, wherein a indicates an atom ratio of Ti, b indicates an atom ratio of Cr, c indicates an atom ratio of Al, d indicates an atom ratio of Si, and x indicates an atom ratio of N.

As described above, the hard film of the shearing die according to the invention has the above-mentioned composition, thereby being able to improve wear resistance and durability.

(4) The shearing die according to any one of (1) to (3), wherein a CrN film having a thickness of 1 μm or more and 5 μm or less is further provided between the hard film and the substrate.

As described above, the shearing die according to the invention comprises the CrN film, thereby being able to improve adhesiveness between the substrate and the hard film.

(5) A method for manufacturing a shearing die which comprises a pair of substrates and is used for shearing a sheet or plate material disposed therebetween by the pair of substrates, wherein at least one of the substrates is composed of a steel, a cemented carbide or a ceramic, and said at least one of the substrates comprise a blade edge having a shape of a curved surface for shearing the sheet or plate material and a surface continuing from the curved surface and facing to a surface of the sheet or plate material, and the method comprises forming a hard film comprising Al and one or more of Ti and Cr at least on a region of the curved surface and a region from the end part of the curved surface on the side facing to the surface of the sheet or plate material to 300 μm along the surface of the substrate, of the surface of said at least one of the substrates, by a filtered arc ion plating method.

As described above, the method for manufacturing a shearing die according to the invention comprises forming the hard film by the filtered arc ion plating method, thereby being able to form the hard film having a small number of metal particles on the surface of the substrate.

According to the shearing die according to the invention, a hard film having excellent wear resistance and durability is formed on specific regions of a surface of a substrate, thereby being able to achieve longer life of the shearing die. Further, according to the method for manufacturing a shearing die according to the invention, the shearing die having longer life can be manufactured.

DESCRIPTION OF REFERENCE NUMERALS AND SIGNS

1: Shearing Die
1a: Substrate
1b: Hard film
2: Sheet or plate material
11: Exhaust port
12: Gas supply port
13: Chamber
13a: Chamber wall
14: Arc evaporation source
15: Arc power supply
16: Substrate stage
17: Supporting table
18: Bias power supply
19: Heater
20: Filament
21: Filament discharge power supply
22: Filament heating power supply
41: Electromagnetic coil
100: Film formation apparatus

DETAILED DESCRIPTION OF THE INVENTION

Embodiments for carrying out the shearing die according to the invention and the manufacturing method thereof will be described in detail below with appropriate reference to the drawings.

<Shearing Die>

The shearing die 1 according to the invention is a die attached to a shearing machine (mechanical type, hydraulic type or the like) and for separating a material showing a sheet or plate shape (a sheet or plate material) by stress (shearing stress). Then, the shearing die 1 according to the invention comprises substrates 1a and 1a disposed in the upper side and lower side of the sheet or plate material and hard films 1b and 1b each formed on respective surfaces of the substrates 1a and 1a, as shown in FIGS. 1 and 2.

Incidentally, in order to protect both the substrates 1a and 1a disposed in the upper side and lower side of the sheet or plate material, it is preferred that the hard film 1b is formed on both the substrates 1a and 1a disposed in the upper side and lower side of the sheet or plate material.

In this embodiment, an example of applying the invention to the shearing die 1 showing a shape in which a face facing to a sheet or plate material 2 approximately linearly extends in a direction perpendicular to paper of FIGS. 1 and 2 (so-called linear blade) is described below. However, the shape of the shearing die 1 is not limited to the above-mentioned shape.

Figure 1:
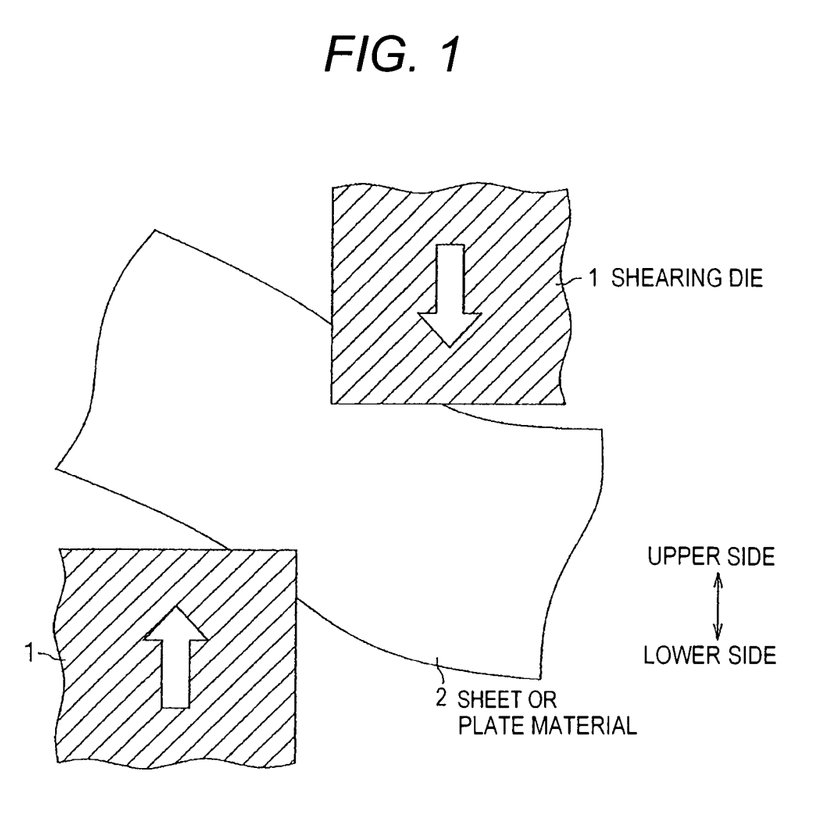
FIG. 1 is a cross-sectional view showing a shearing die according to the invention and a sheet or plate material in a course of shearing the sheet or plate material by the shearing die.
Figure 2:
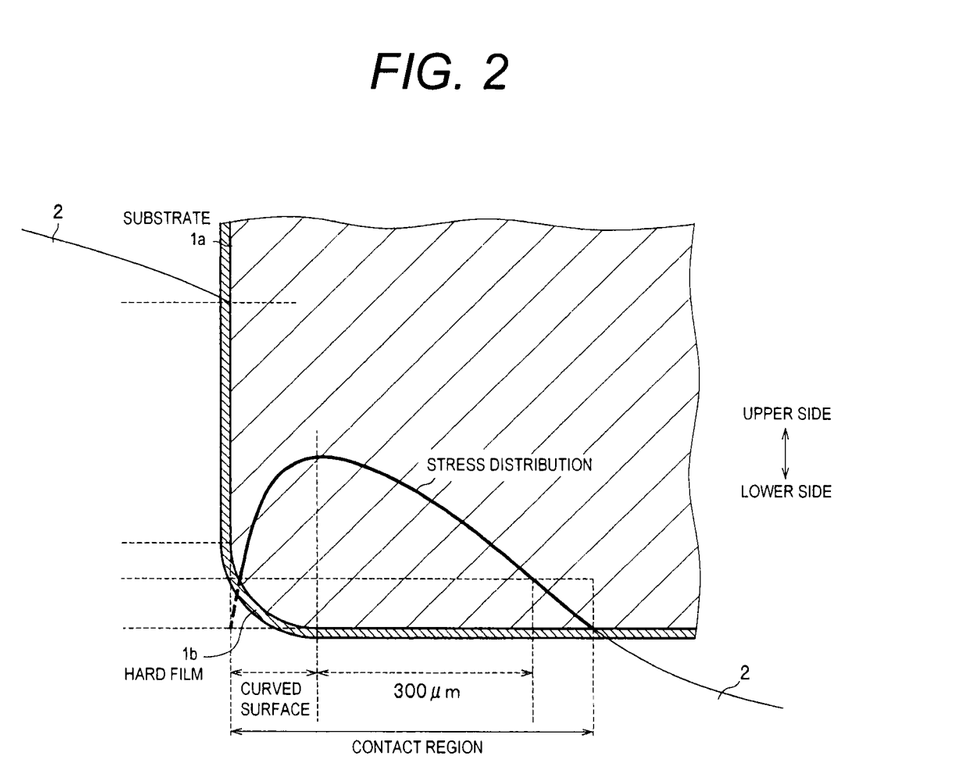
FIG. 2 is an enlarged cross-sectional view showing a shearing die according to the invention and a sheet or plate material in a course of shearing the sheet or plate material by the shearing die.

The invention can also be applied, for example, to the shearing die 1 showing a shape in which the face facing to the sheet or plate material 2 extends in an arc in a direction perpendicular to paper of FIGS. 1 and 2 (so-called rotary blade), as long as it is a die which shears the sheet or plate material by shearing stress.

The substrate 1*a* of the shearing die 1 will be described below.

<Substrate>

The substrate 1*a* of the shearing die 1 is composed of a steel, a cemented carbide or a ceramic. The steel as used herein is an alloy comprising Fe as a main component. Here, an alloy comprising Fe as a main component generally means that an alloy comprises Fe in an amount of more than 50% by mass. Further, the cemented carbide is an alloy produced by sintering hard metal carbide. The specific example of the hard metal carbide constituting the cemented carbide includes WC (tungsten carbide). In addition, WC in which a slight amount of TiC (titanium carbide) or TaC (tantalum carbide) is contained is also exemplified as the hard metal carbide.

The substrate 1*a* of the shearing die 1 comprises a blade edge having a shape of a curved surface for shearing the sheet or plate material 2 and a surface continuing from the curved surface and facing to a surface of the sheet or plate material 2. The blade edge means an edge part of the substrate 1*a* which shears the sheet or plate material 2. Then, in order to decrease damage of the sheet or plate material 2 at the time of shearing, the blade edge shows a shape of the curved surface in cross section (see FIG. 2).

Incidentally, of a pair of substrates 1*a* and 1*a*, the blade edge of one substrate has the curved surface shape, and the blade edge of the other substrate may have either the curved surface shape or no curved surface shape. From the viewpoint of inhibiting Burr, it is preferred that the blade edge of the other substrate has no curved surface shape.

The overall shape of the substrate 1*a* of the shearing die 1 is not particularly limited, as long as it is possible to shear the sheet or plate material by shearing stress, as described above. For example, it is an approximate rectangular parallelepiped shape, an approximate disc shape or the like. Further, the pair of substrates 1*a* and 1*a* may have the same shape or different shapes.

Furthermore, the blade edge (edge for shearing the sheet or plate material 2) of the substrate 1*a* of the shearing die 1 is not limited to one showing a right angle as shown in FIGS. 1 and 2, and may be one showing an acute angle (less than) 90°. Here, in the case where the substrate 1*a* comprises a blade edge having a shape of a curved surface, the blade edge showing a right angle means that an angle formed at the blade edge by extending two surfaces, each of which continues from the curved surface, shows a right angle.

The hard film 1*b* of the shearing die 1 will be described below.

<Hard Film>

(Region in which Hard Film is Provided)

The hard film 1*b* of the shearing die 1 is formed at least on a region of the curved surface and a region from the end part of the curved surface on the side facing to the surface of the sheet or plate material 2 to 300 μm along the surface of the substrate 1*a* (the above-mentioned two regions may be hereinafter referred to as a protection region hereinafter), of the surface of the substrate 1*a*.

The reason for this is that when the sheet or plate material 2 is sheared by using the shearing die 1 as shown in FIG. 2, a high stress is particularly applied to the protection region, of a region where the shearing die 1 and the sheet or plate material 2 come into contact with each other.

Here, a region in which the hard film 1*b* is formed has only to include at least the protection region. Thus, for example, the hard film 1*b* may be provided on the whole substrate 1*a* of the shearing die 1.

Incidentally, FIG. 2 shows stress distribution at the edge (edge for shearing the sheet or plate material 2) of the substrate 1*a* of the shearing die 1, and the range to which a high stress is applied is the region of the curved surface and the narrow range from an end part of the curved surface (within 300 μm from the end part of the curved surface along the surface of the substrate). Accordingly, for the shearing die 1 in which the edge of the substrate 1*a* has an angle of 90° or less, improvements in wear resistance and durability can be secured by forming the hard film 1*b* at least on the protection region. Here, in the case where the substrate 1*a* comprises a blade edge having a shape of a curved surface, the angle of the edge of the substrate 1*a* means that an angle formed at the edge of the substrate 1*a* by extending two surfaces, each of which continues from the curved surface, shows a right angle.

(Material of Hard Film)

The hard film 1*b* comprises Al and one or more of Ti and Cr. The reason for such a requirement is that Al is an essential element for improving wear resistance of the hard film 1*b*, and that Ti and Cr are elements for improving wear resistance and durability of the hard film 1*b*.

Specifically, the hard film 1*b* is a film of (Ti, Al)(CN), (Cr, Al)(CN) or (Ti, Cr, Al)(CN), or a film thereof in which Si is allowed to be contained. Of these, preferred one is a film in which both of Ti and Cr are contained.

Further, the hard film 1*b* is preferably composed of $(Ti_aCr_bAl_cSi_d)(C_{1-x}N_x)$, satisfying $0 \leq a \leq 0.3$, $0.1 \leq b \leq 0.5$, $0.3 \leq c \leq 0.7$, $0 \leq d \leq 0.2$, $a+b+c+d=1$ and $0.7 \leq x \leq 1$ (wherein a indicates an atom ratio of Ti, b indicates an atom ratio of Cr, c indicates an atom ratio of Al, d indicates an atom ratio of Si, and x indicates an atom ratio of N). The hard film 1*b* having the above-mentioned composition can further improve wear resistance and durability thereof.

The reason for restricting the above-mentioned composition will be described in detail below.

Al and Cr improve wear resistance of the hard film 1*b* by forming an (Al, Cr)(CN) film, so that the atom ratio c of Al in the above-mentioned composition formula is preferably $0.3 \leq c \leq 0.7$, and the atom ratio b of Cr is preferably $0.1 \leq b \leq 0.5$. More preferably, the atom ratio c of Al is $0.4 \leq c \leq 0.6$, and the atom ratio b of Cr is $0.15 \leq b \leq 0.3$.

Ti is an element for increasing the hardness of the hard film 1*b* to improve wear resistance. However, the excessive content thereof may make the hard film 1*b* brittle. Accordingly, the atom ratio a of Ti in the above-mentioned composition formula is preferably $0 \leq a \leq 0.3$.

Si is an element for refining crystals in the hard film 1*b*, thereby improving hardness and resistance to high contact pressure. However, the excessive content thereof may make the hard film 1*b* amorphous. Accordingly, the atom ratio d of Si in the above-mentioned composition formula is preferably $0 \leq d \leq 0.2$. More preferably, the atom ratio d of Si is $0 \leq d \leq 0.15$.

Incidentally, taking it into consideration that the hard film 1*b* is made amorphous by an increase in the Si content, it is further preferred that for the atom ratio c of Al and the atom ratio d of Si in the above-mentioned composition formula, (c+d) is 0.6 or less.

C is an element for increasing the hardness of the hard film 1*b* to improve wear resistance. However, the excessive content thereof may cause the hardness of the hard film 1*b* to decrease. Accordingly, the atom ratio (1−x) of C in the above-mentioned composition formula is preferably less than 0.3, namely $0.7 \leq x \leq 1$.

(Thickness of Hard Film)

When the hard film 1b is formed on the surface of the substrate 1a by an arc ion plating method (or a filtered arc ion plating method), a residual compression stress is generated in the hard film 1b. In particular, when the hard film 1b is formed thickly on the curved surface provided at the edge for shearing the sheet or plate material 2, of the surface of the substrate 1a, separation or a fracture phenomenon occurs in an interface (an interface between the substrate 1a and the hard film 1b) or in the inside of the hard film 1b.

Accordingly, the thickness of the hard film 1b is required to be 1 µm or more and 5 µm or less. More preferably, it is 1 µm or more and 3 µm or less.

Incidentally, the thickness of the hard film 1b can be controlled by the film formation method described later.

(Metal Particles in Hard Film)

A metal particles having a diameter of 20 µm or more, which is present in the hard film 1b, causes damage of the hard film 1b. Further, it is necessary to inhibit the presence of the metal particle in the hard film 1b formed on the region of the curved surface to which the highest stress is applied at the time of shearing the sheet or plate material 2 by the shearing die 1 and the region from the end part of the curved surface on the side facing to the surface of the sheet or plate material 2 to 300 µm along the surface of the substrate.

Accordingly, the damage of the hard film 1b at the time of shearing the sheet or plate material 2 can be inhibited by restricting the number of metal particle having a diameter of 20 µm or more, which is present on a line segment having a length of 10 mm on a surface of the hard film formed on the region of the curved surface and the region from the end part of the curved surface on the side facing to the surface of the sheet or plate material to 300 µm along the surface of the substrate, to 2 or less. More preferably, the number of metal particle is 0. Then, the number of metal particle having a diameter of 20 µm or more can be controlled by the film formation method described later.

Incidentally, the metal particle is an aggregate of metals such as Ti, Cr and Al which are present in the hard film 1b.

Here, the metal particle which is present on a line segment having a length of 10 mm means a metal particle completely cut with the line segment.

Further, the diameter is a diameter of a cross section of the metal particle at the time when the metal particle is viewed from a direction perpendicular to the surface of the hard film 1b. When the shape of the cross section is not circular, the longest length (span) between both ends is taken as the diameter.

Incidentally, it is preferred that the line segment is set in the approximately same direction as a direction in which the blade edge (edge) extends (a ridge line direction), on the surface of the hard film 1b formed on the region of the curved surface and the region from the end part of the curved surface on the side facing to the surface of the sheet or plate material to 300 µm along the surface of the substrate.

(Surface Shape of Hard Film)

In the shearing die 1, the contact region with the sheet or plate material 2 is concentrated in a narrow region in a vicinity of the edge (blade edge), different from a plastic forming die (such as a bending or drawing die) in which the contact region with the sheet or plate material 2 is large. Accordingly, a stress applied to that region is very large. Then, the stress acts in a direction approximately perpendicular to a surface of the die. Accordingly, when the surface of the hard film 1b has an unevenness, the stress is concentrated on convex portions, thereby easily causing damage of the film.

Accordingly, the maximum peak height (Rp) of the hard film 1b is preferably 1 µm or less. More preferably, it is 0.5 µm or less. The maximum peak height (Rp) is further more preferably 0 µm since the hard film 1b having the flatter surface is preferred. However, from the stand point of the easiness of production, the hard film 1b having the maximum peak height (Rp) of 0.05 µm or more can be preferably used. The maximum peak height (Rp) is defined in JIS B 0601 (2001).

The maximum peak height is a maximum value of peak heights of a profile curve in a reference length. The maximum peak height (Rp) is measured in any three places with a stylus surface roughness meter, Dektak 6M, manufactured by Sloan (at a scanning length of 1 mm, a scanning rate of 1 mm/15 sec and a load of 20 mgf), and the average value thereof is calculated.

It is more preferred that the measurement is performed to the hard film 1b formed on the region of the curved surface for shearing the sheet or plate material 2 and the region from the end part of the curved surface on the side facing to the surface of the sheet or plate material 2 to 300 µm along the surface of the substrate, of the surface of the hard film 1b.

(CrN Film)

The hard film 1b comprises Al in order to increase the hardness, so that residual stress is also increased. As a result, there is a tendency that adhesiveness of the substrate 1a to the hard film 1b is decreased. It is therefore preferred to form an intermediate layer (not shown in Figure) composed of CrN between the substrate 1a and the hard film 1b, in order to improve adhesiveness of the substrate 1a to the hard film 1b. Further, when the thickness of the CrN film is less than 1 µm, effects of improving the adhesiveness and decreasing the residual stress may be small. On the other hand, when it exceeds 5 µm, these effects may be saturated. Accordingly, the thickness of the CrN film is preferably from 1 to 5 µm.

Incidentally, the CrN film comprises Cr and N as main components (for example, the total atomic percent of Cr and N is 80 at % or more, and more preferably 90 at % or more). As the content ratio of Cr and N, it is represented as $Cr_{1-x}N_x$ wherein x is 0.3 to 0.55.

The manufacturing method of the shearing die 1 will be described below.

<Manufacturing Method of Shearing Die>

The shearing die 1 is manufactured by forming the hard film 1b at least on the protection region of the substrate 1a, of the surface of the substrate 1a, by the arc ion plating method (hereinafter appropriately referred to as the AIP method). The AIP method as used herein is a film formation method of coating the surface of the substrate with an ion evaporation material by utilizing arc discharge.

The hard film 1b can be properly formed on the surface of the substrate 1a by using the AIP method. Further, it is preferred that after the formation of the hard film 1b by the AIP method, the surface of the hard film 1b is smoothened by polishing to a maximum peak height (Rp) of 1.0 µm or less.

Furthermore, among the AIP methods, it is preferred to apply the filtered arc ion plating method (hereinafter appropriately referred to as the filtered AIP method). The filtered AIP method as used herein is a kind of the AIP method and a film formation method of coating the surface of the substrate 1a with an ion evaporation material while preventing metal particles (molten particles of a target) from adhering to the substrate 1a.

The use of the filtered AIP method allows to form the hard film 1b containing a markedly small amount of metal particles compared to the conventional AIP method, so that the hard film 1b having a low maximum peak height (Rp) can be obtained without performing the polishing after the film formation (or by the minimal polishing). The Rp of the hard film 1b after the film formation by the filtered AIP method is 2 μm or less, and is reduced to 0.1 μm or less by polishing the hard film 1b after the film formation.

For the shearing die 1 to which a high stress is applied, it is particularly effective to use the filtered AIP method.

The reason for this is as follows. When the hard film 1b comprising Al, Ti, Cr and the like is intended to be formed using the conventional AIP method, the metal particles (molten particles of the target) are scattered at the same time as the target is evaporated by arc discharge, because elements having different melting points are contained in the target, and the metal particles come to be mixed in the hard film 1b. As a result, unevenness is liable to be formed on the surface of the hard film 1b. Accordingly, when the film formation is performed using the conventional AIP method, it is preferred to smoothen the surface by polishing. However, in the case of the shearing die 1 having the acute-angled edge, polishing is extremely difficult in some cases. Accordingly, the filtered AIP method requiring no polishing (or minimum polishing) after the film formation is effective for the shearing die 1 to which a high stress is applied.

Incidentally, in the case of forming the CrN film, the CrN film is first formed on the surface of the substrate 1a by the AIP method or the filtered AIP method, and thereafter, the hard film 1b is formed thereon by the same method.

The arc ion plating method and the filtered arc ion plating method will be described in detail below with reference to FIGS. 3, 4 and 5.

<Arc Ion Plating Method>

Figure 3:
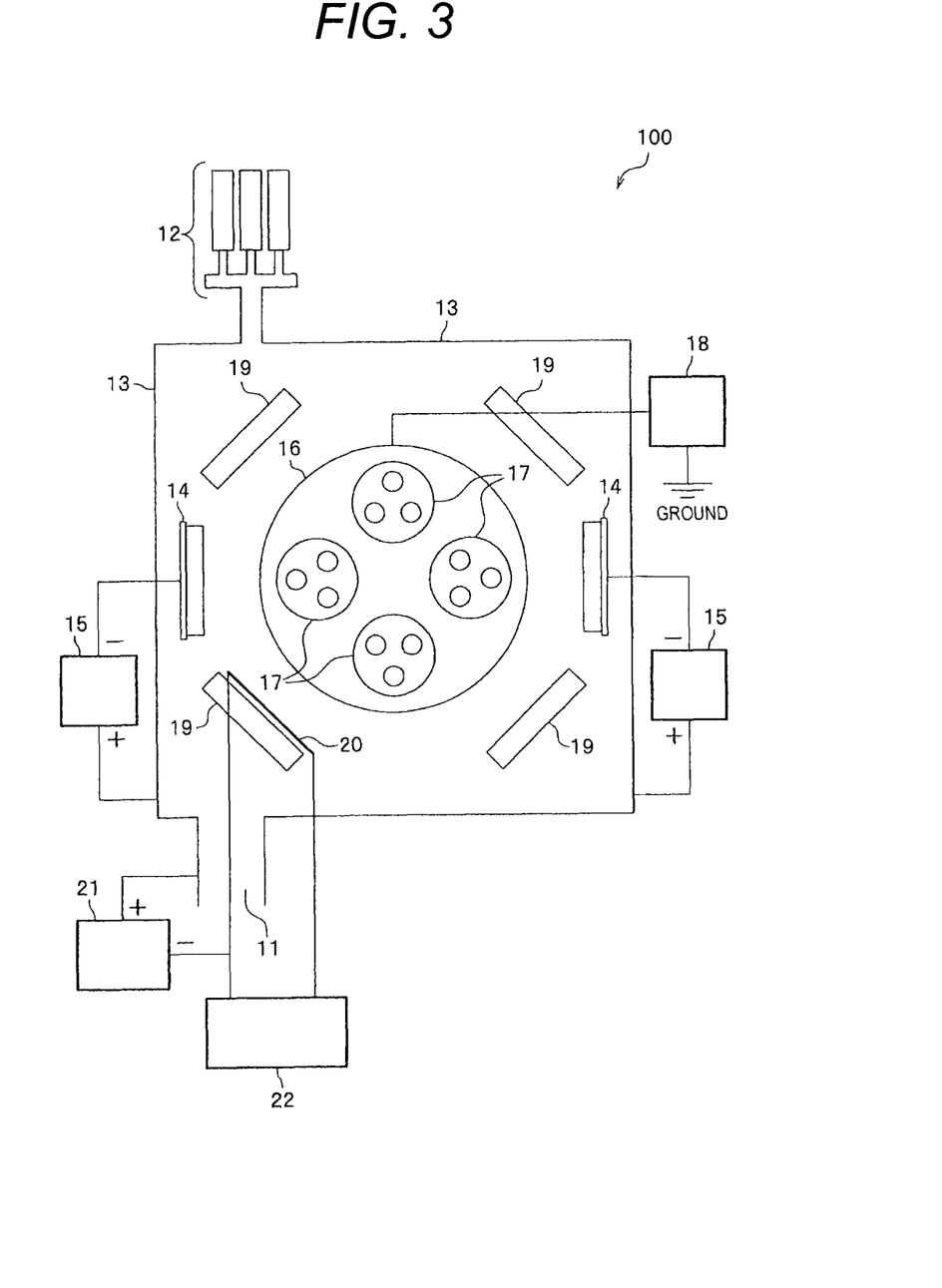
FIG. 3 is a schematic view showing an arc ion plating apparatus used in a manufacturing method of a shearing die according to the invention.

The arc ion plating method is performed using a film formation apparatus 100 shown in FIG. 3.

As shown in FIG. 3, the film formation apparatus 100 comprises a chamber 13 having an exhaust port 11 for vacuum exhaust and a gas supply port 12 for supplying $N_2$ gas, Ar gas, $CH_4$ gas or the like, arc power supplies 15 connecting to arc evaporation sources 14, supporting tables 17 provided on a substrate stage 16, for supporting bodies to be treated (not shown in Figure) which are bodied to be film-formed, and a bias power supply 18 for applying negative bias voltage to the bodies to be treated through the supporting tables 17 between the supporting tables 17 and the chamber 13. In addition, the film formation apparatus 100 comprises heaters 19, a filament 20, a filament discharge power supply 21 and a filament heating power supply 22.

First, targets are each attached to the arc evaporation sources 14 of the film formation apparatus 100, and substrates 1a are each attached as the bodies to be treated (not shown in Figure) onto the supporting tables 17 on the rotating substrate stage 16. The inside of the chamber 13 is evacuated (exhausted to $1 \times 10^{-3}$ Pa or less) to a vacuum state. Then, the bodies to be treated are heated to a temperature of about 400° C. with the heaters 19 in the chamber 13. Thereafter, an arc current of 150 A is supplied from the arc evaporation sources 14 to the targets having a diameter of 100 mm in a $N_2$ atmosphere, an Ar atmosphere, a $CH_4$ atmosphere or a mixed gas atmosphere thereof, having a total pressure of 4 Pa, thereby forming hard films 1b on the substrates 1a.

<Filtered Arc Ion Plating Method>

Figure 4:
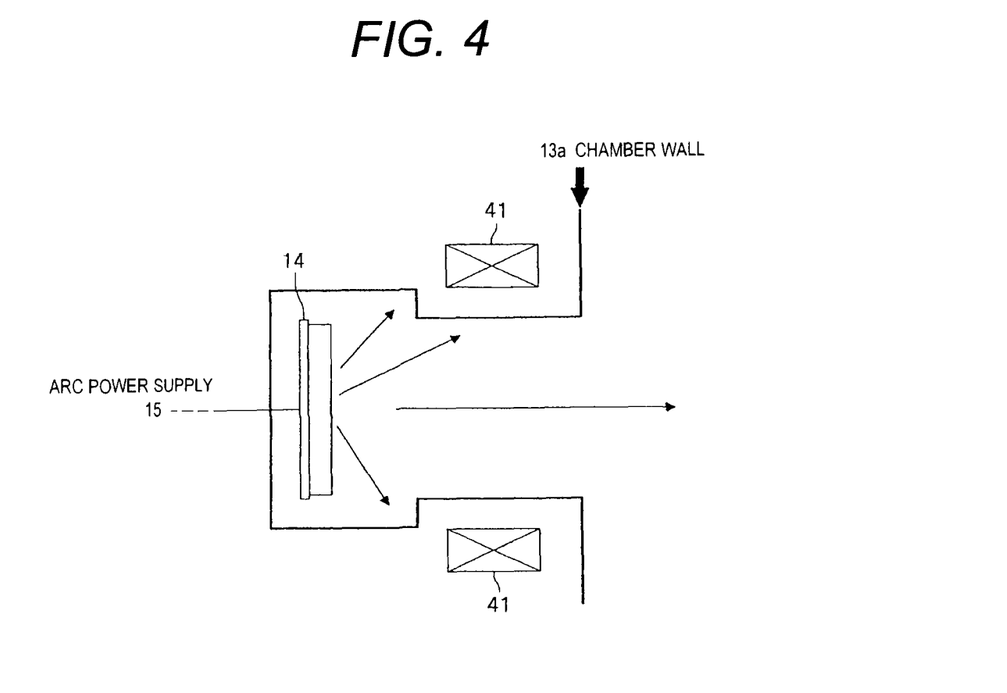
FIG. 4 is a schematic view showing a linear type arc evaporation source of a filtered arc ion plating apparatus used in a method for manufacturing a shearing die according to the invention.
Figure 5:
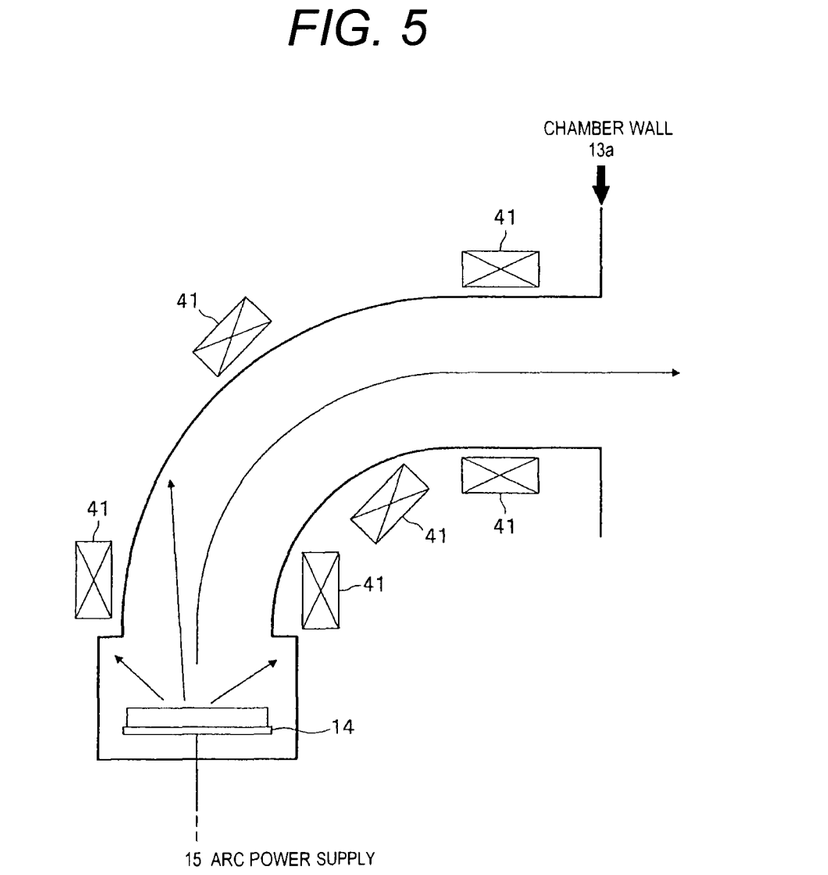
FIG. 5 is a schematic view showing a 90° curved type arc evaporation source of a filtered arc ion plating apparatus used in a method for manufacturing a shearing die according to the invention.

The filtered AIP method is performed using an apparatus in which a part of an arc evaporation source 14 of the film formation apparatus 100, which is shown in FIG. 3, is constituted as shown in FIGS. 4 and 5 (hereinafter appropriately referred to as a filtered film formation apparatus).

The filtered film formation apparatus has a duct comprising a magnetic induction mechanism composed of a plurality of electromagnetic coils 41, in front of the arc evaporation source 14. By having the duct comprising the magnetic induction mechanism, the metal particles which are liable to be discharged at a small angle to a surface of the target can be trapped with the duct. As a result, only ionized target atoms can be induced to the substrate 1a by a magnetic field.

In the arc evaporation source 14, the shape of the duct may be linear (a linear type arc evaporation source) as shown in FIG. 4, or may be curved at 90° (a 90° curved type evaporation source) as shown in FIG. 5. Further, the shape thereof may be curved at an angle of more than 90°.

While embodiments of the invention have been described above, the invention is not limited to the above-mentioned embodiments, and variations may be appropriately made without departing from the gist of the invention described in the claims.

Examples

The shearing die and the manufacturing method thereof according to the invention will be specifically described below, by contrasting Examples (test material Nos. 2, 4, 6, 8 to 10, 13 to 21, 23, 24 and 26 to 46), in which the effects of the invention have been confirmed, to Comparative Examples (test material Nos. 1, 3, 5, 7, 11, 12, 22 and 25), in which the requirements of the invention are not satisfied.

<Preparation of Test Materials>

Hard films shown in Tables 1 to 3 were each formed on a substrate composed of die steel (JIS-SKD11, HRC60), using the film formation apparatus shown in FIG. 3 ("conventional arc" in Tables), the film formation apparatus mounting the linear type arc evaporation source shown in FIG. 4 ("filtered 1" in Tables), the film formation apparatus mounting the 90° curved type arc evaporation source shown in FIG. 5 ("filtered 2" in Tables) or a holocathode type film formation apparatus ("HCD" in Tables).

As a film formation method, the substrate was first placed in the film formation apparatus, and the inside of the chamber was exhausted to $1 \times 10^{-3}$ Pa or less. Thereafter, the substrate was heated to 400° C., and then subjected to sputter cleaning using Ar ions. After nitrogen was introduced into the chamber to 4 Pa, arc discharge was performed at a current of 150 A to form the hard film on the substrate. Incidentally, after the hard film formation, some test materials were subjected to polishing with a polishing apparatus. Further, before the hard film formation, CrN film formation was performed for some test materials.

After the film formation or after the polishing, the composition of the hard film, the number of metal particles, the maximum peak height (Rp) and the hardness (GPa) were measured, and a shearing test was performed.

<Measuring Methods>

The composition of the hard film was measured with an EPMA (Electron Probe Micro Analyzer).

For the number of metal particles, 10 line segments having a length of 10 mm were arbitrarily selected on a surface of the hard film formed on a region of the curved surface of the test material (shearing die) and a region from the end part of the curved surface on the side facing to the surface of the sheet or plate material to 300 μm along the surface of the substrate. Then, a cross section of the hard film cut in a direction perpendicular to the curved surface from the line segment was observed using an optical microscope at a magnification of 400 times, and the number of metal particles having a diameter of 20 μm or more which were exposed on the cross section was counted. Then, an average value of the numbers of metal particles in the 10 line segments was calculated, and the average value was taken as the number of metal particles.

The hardness (Vickers hardness) was measured using a Vickers indenter under conditions of a load of 25 gf and a retention time of 15 seconds.

The maximum peak height (Rp) was measured using a stylus surface roughness meter, DEKTAK 6M, manufactured by Sloan, at a scanning distance of 1 mm.

<Test Method>

Using the test material (linear blade) prepared by the above-mentioned method, the shearing test of a high-tensile steel sheet having a tensile strength of 980 MPa, a thickness of 2 mm and a width of 100 mm was performed. A shearing test was constructed so that the steel sheet was sheared by the pair of test materials disposed in the upper side and lower side of the steel sheet, and the test was performed under conditions that the stroke number was 90 spm, and that the clearance between the test materials was 10% (0.2 mm) of the thickness of the steel sheet.

Incidentally, the size of shear surfaces of the test materials was 150 mm (the length in a direction cutting the steel sheet)× 100 mm.

<Evaluation Method>

As the evaluation method, damage of the shear surfaces (the whole area of a part which came into contact with the steel sheet) was observed at given time intervals, and the time when the damage of 200 μm or more occurred in that part was judged as the life of the test materials.

The case where the tool life (the stroke number until the occurrence of the damage) was 35,000 or more was evaluated as good, and the case where the tool life was less than 35,000 was evaluated as poor.

Incidentally, all test materials shown in Table 1 were polished to a maximum peak height (Rp) of 0.6 to 0.8 μm. Further, all test materials shown in Table 2 had a metal particle number of 2 or less. Furthermore, all test materials shown in Table 3 were polished to a maximum peak height (Rp) of 0.5 μm or less and had a metal particle number of 2 or less.

TABLE 1

| Test Material No. | Hard Film Deposition System | Hard Film Composition | Hard Film Thickness (μm) | CrN Film Formed or Not formed | CrN Film Thickness (μm) | Hardness (GPa) | Polishing | Number of Metal Particles | Tool Life (Stroke Number) | |
|---|---|---|---|---|---|---|---|---|---|---|
| 1 | Conventional arc | (Ti0.5Al0.5)N | 3 | Not formed | — | 2,800 | Polished | 5 | 5,000 | Comparative Example |
| 2 | Filtered 1 | (Ti0.5Al0.5)N | 3 | Not formed | — | 3,000 | Polished | 1 | 120,000 | Example |
| 3 | Conventional arc | (Cr0.5Al0.5)N | 3 | Not formed | — | 2,800 | Polished | 4 | 8,000 | Comparative Example |
| 4 | Filtered 1 | (Cr0.5Al0.5)N | 3 | Not formed | — | 3,100 | Polished | 2 | 65,000 | Example |
| 5 | Conventional arc | (Ti0.2Cr0.2Al0.6)N | 3 | Formed | 2 | 3,300 | Polished | 4 | 9,000 | Comparative Example |
| 6 | Filtered 1 | (Ti0.2Cr0.2Al0.6)N | 3 | Formed | 2 | 3,500 | Polished | 0 | 220,000 | Example |
| 7 | Conventional arc | (Ti0.2Cr0.2Al0.55Si0.05)N | 3 | Formed | 2 | 3,400 | Polished | 5 | 12,000 | Comparative Example |
| 8 | Filtered 1 | (Ti0.2Cr0.2Al0.55Si0.05)N | 3 | Formed | 2 | 3,600 | Polished | 0 | 250,000 | Example |
| 9 | Filtered 1 | (Ti0.2Cr0.2Al0.55Si0.05)N | 3 | Formed | 2 | 3,600 | Polished | 1 | 180,000 | Example |
| 10 | Filtered 2 | (Ti0.2Cr0.2Al0.55Si0.05)N | 3 | Formed | 2 | 3,600 | Polished | 0 | 210,000 | Example |

TABLE 2

| Test Material No. | Hard Film Deposition System | Hard Film Composition | Hard Film Thickness (μm) | CrN Film Formed or Not formed | CrN Film Thickness (μm) | Hardness (GPa) | Polishing | Rp (μm) | Tool Life (Stroke Number) | |
|---|---|---|---|---|---|---|---|---|---|---|
| 11 | HCD | TiN | 3 | Not formed | — | 2,200 | Not polished | 0.5 | 3,000 | Comparative Example |
| 12 | Filtered 1 | CrN | 3 | Not formed | — | 1,500 | Polished | 0.6 | 30,000 | Comparative Example |
| 13 | Filtered 1 | (Ti0.5Al0.5)N | 3 | Not formed | — | 2,800 | Not polished | 1.2 | 50,000 | Example |
| 14 | Filtered 1 | (Ti0.5Al0.5)N | 3 | Not formed | — | 2,800 | Polished | 0.6 | 75,000 | Example |
| 15 | Filtered 1 | (Cr0.5Al0.5)N | 3 | Not formed | — | 2,800 | Not polished | 2.2 | 50,000 | Example |
| 16 | Filtered 1 | (Cr0.5Al0.5)N | 3 | Not Formed | — | 2,800 | Polished | 0.7 | 70,000 | Example |
| 17 | Filtered 1 | (Ti0.2Cr0.2Al0.6)N | 3 | Not formed | — | 3,300 | Not polished | 2.3 | 60,000 | Example |
| 18 | Filtered 1 | (Ti0.2Cr0.2Al0.6)N | 3 | Not formed | — | 3,300 | Polished | 1.5 | 80,000 | Example |
| 19 | Filtered 1 | (Ti0.2Cr0.2Al0.6)N | 3 | Not formed | — | 3,300 | Polished | 0.8 | 110,000 | Example |
| 20 | Filtered 1 | (Ti0.2Cr0.2Al0.6)N | 3 | Not formed | — | 3,300 | Polished | 0.65 | 130,000 | Example |
| 21 | Filtered 1 | (Ti0.2Cr0.2Al0.6)N | 3 | Not formed | — | 3,300 | Polished | 0.3 | 200,000 | Example |
| 22 | Filtered 1 | (Ti0.2Cr0.2Al0.6)N | 0.5 | Not formed | — | 3,300 | Polished | 0.25 | 13,000 | Comparative Example |
| 23 | Filtered 1 | (Ti0.2Cr0.2Al0.6)N | 1.5 | Not formed | — | 3,300 | Polished | 0.25 | 20,000 | Example |
| 24 | Filtered 1 | (Ti0.2Cr0.2Al0.6)N | 4 | Not Formed | — | 3,300 | Polished | 0.4 | 210,000 | Example |
| 25 | Filtered 1 | (Ti0.2Cr0.2Al0.6)N | 7 | Not formed | — | 3,300 | Polished | 0.55 | 32,000 | Comparative Example |
| 26 | Filtered 1 | (Ti0.2Cr0.2Al0.6)C0.2N0.8 | 4 | Not formed | — | 3,300 | Polished | 0.55 | 150,000 | Example |

TABLE 3

| Test Material No. | Deposition System | Hard Film Composition | Thickness (μm) | CrN Film Formed or Not formed | Thickness (μm) | Hardness (GPa) | Tool Life (Stroke Number) | |
|---|---|---|---|---|---|---|---|---|
| 27 | Filtered 1 | (Ti0.2Cr0.2Al0.6)N | 3 | Not formed | — | 3,300 | 120,000 | Example |
| 28 | Filtered 1 | (Ti0.2Cr0.2Al0.6)N | 3 | Formed | 2 | 3,300 | 180,000 | Example |
| 29 | Filtered 1 | (Ti0.2Cr0.2Al0.6)N | 3 | Formed | 0.5 | 3,300 | 120,000 | Example |
| 30 | Filtered 1 | (Ti0.2Cr0.2Al0.6)N | 3 | Formed | 4 | 3,300 | 180,000 | Example |
| 31 | Filtered 1 | (Ti0.2Cr0.2Al0.6)N | 3 | Formed | 7 | 3,300 | 110,000 | Example |
| 32 | Filtered 1 | (Ti0.35Cr0.35Al0.3)N | 3 | Formed | 2 | 2,500 | 60,000 | Example |
| 33 | Filtered 1 | (Ti0.25Cr0.25Al0.5)N | 3 | Formed | 2 | 3,200 | 80,000 | Example |
| 34 | Filtered 1 | (Ti0.2Cr0.2Al0.6)N | 3 | Formed | 2 | 3,300 | 120,000 | Example |
| 35 | Filtered 1 | (Ti0.1Cr0.1Al0.8)N | 3 | Formed | 2 | 2,400 | 60,000 | Example |
| 36 | Filtered 1 | (Ti0.4Cr0.1Al0.5)N | 3 | Formed | 2 | 2,700 | 50,000 | Example |
| 37 | Filtered 1 | (Ti0.3Cr0.2Al0.5)N | 3 | Formed | 2 | 3,000 | 90,000 | Example |
| 38 | Filtered 1 | (Ti0.1Cr0.5Al0.4)N | 3 | Formed | 2 | 3,200 | 80,000 | Example |
| 39 | Filtered 1 | (Ti0.1Cr0.6Al0.3)N | 3 | Formed | 2 | 2,600 | 55,000 | Example |
| 40 | Filtered 1 | (Ti0.2Cr0.2Al0.58Si0.02)N | 3 | Formed | 2 | 3,300 | 220,000 | Example |
| 41 | Filtered 1 | (Ti0.2Cr0.2Al0.55Si0.05)N | 3 | Formed | 2 | 3,400 | 250,000 | Example |
| 42 | Filtered 1 | (Ti0.2Cr0.2Al0.5Si0.1)N | 3 | Formed | 2 | 3,400 | 200,000 | Example |
| 43 | Filtered 1 | (Ti0.2Cr0.2Al0.4Si0.2)N | 3 | Formed | 2 | 3,100 | 160,000 | Example |
| 44 | Filtered 1 | (Ti0.2Cr0.2Al0.3Si0.3)N | 3 | Formed | 2 | 2,500 | 55,000 | Example |
| 45 | Filtered 1 | (Cr0.4Al0.55Si0.05)N | 3 | Formed | 2 | 3,400 | 130,000 | Example |
| 46 | Filtered 1 | (Cr0.4Al0.6)N | 3 | Formed | 2 | 3,300 | 70,000 | Example |

As shown in Table 1, in Test Material Nos. 2, 4, 6 and 8 to 10, the composition of the hard films met the composition specified in the invention, and both the thickness of the hard films and the number of metal particles were within the ranges specified in the invention. Accordingly, the life (stroke number) of the shearing dies was 35,000 or more, resulting in good evaluation.

On the other hand, in Test Material Nos. 1, 3, 5 and 7, the number of metal particles exceeded the range specified in the invention, so that the life of the shearing dies was less than 35,000, resulting in poor evaluation.

As shown in Table 2, in Test Material Nos. 13 to 21, 23, 24 and 26, the composition of the hard films met the composition specified in the invention, and both the thickness of the hard films and the number of metal particles were within the ranges specified in the invention. Accordingly, the life of the shearing dies was 35,000 or more, resulting in good evaluation.

On the other hand, in Test Material Nos. 11 and 12, the composition of the hard films was not the composition specified in the invention, so that the life of the shearing dies was less than 35,000, resulting in poor evaluation.

Further, in Test Material Nos. 22 and 25, the thickness of the hard films exceeded the range specified in the invention, so that the life of the shearing dies was less than 35,000, resulting in poor evaluation.

As shown in Table 3, in Test Material Nos. 27 to 46, the composition of the hard films met the composition specified in the invention, and both the thickness of the hard films and the number of metal particles were within the ranges specified in the invention. Accordingly, the life of the shearing dies was 35,000 or more, resulting in good evaluation.

From the above results, it has been found that the life of shearing dies can be prolonged according to the shearing die and the method for manufacturing the shearing die according to the invention.

The invention claimed is:

1. A shearing die, comprising a pair of substrates, wherein at least one substrate comprises a steel, a cemented carbide or a ceramic, and has a blade edge comprising:
   a curved surface having a rounded edge for shearing a sheet or plate material;
   an adjacent surface continuing from the curved surface along a surface of the substrate and facing a surface of the sheet or plate material; and
   a hard film formed by an arc ion plating method at least on a region of the curved surface and on a region of the adjacent surface from the end of the curved surface to 300 μm along the surface of the substrate,
   wherein:
   the hard film comprises $(Ti_aCr_bAl_cSi_d)(C_{1-x}N_x)$; wherein:
   $0 \leq a \leq 0.3$;
   $0.1 \leq b \leq 0.5$;
   $0.3 \leq c \leq 0.7$;
   $0 \leq d \leq 0.2$;
   $a+b+c+d=1$; and
   $0.7 \leq x \leq 1$,
   such that a indicates an atom ratio of Ti, b indicates an atom ratio of Cr, c indicates an atom ratio of Al, d indicates an atom ratio of Si, and x indicates an atom ratio of N;
   the hard film has a thickness of 1 μm or more and 5 μm or less; and
   a number of metal particles having a diameter of 20 μm or more, which are present on a line segment having a length of 10 mm on a surface of the hard film formed on the region of the curved surface and the region of the adjacent surface from the end part of the curved surface to 300 μm along the surface of the substrate, is 2 or less.

2. The shearing die according to claim 1, wherein a maximum peak height (Rp) of the surface of the hard film is 1.0 μm or less.

3. The shearing die according to claim 1, wherein a CrN film having a thickness of 1 μm or more and 5 μm or less is further provided between the hard film and the substrate.

4. The shearing die according to claim 2, wherein a CrN film having a thickness of 1 μm or more and 5 μm or less is further provided between the hard film and the substrate.

5. A method for manufacturing the shearing die according to claim 1, the method comprising forming the hard film at least on the region of the curved surface and on the region of the adjacent surface from the end of the curved surface on the side facing to the surface of the sheet or plate material to 300 μalong the surface of the substrate, by filtered arc ion plating.

6. The shearing die according to claim 1, wherein the hard film comprises Al, Ti and Cr.

7. The shearing die according to claim 2, wherein the hard film comprises Al, Ti and Cr.

8. The shearing die according to claim 3, wherein the hard film comprises Al, Ti and Cr.

* * * * *